United States Patent
Yamazaki et al.

(10) Patent No.: US 10,707,810 B2
(45) Date of Patent: Jul. 7, 2020

(54) PIEZOELECTRIC OSCILLATION DEVICE AND MANUFACTURING METHOD THEREFOR

(71) Applicant: Murata Manufacturing Co., Ltd., Nagaokakyo-shi, Kyoto-fu (JP)

(72) Inventors: Takuya Yamazaki, Nagaokakyo (JP); Toshikatsu Ohitsu, Nagaokakyo (JP); Hiroaki Kaida, Nagaokakyo (JP)

(73) Assignee: MURATA MANUFACTURING CO., LTD., Nagaokakyo-Shi, Kyoto-Fu (JP)

( * ) Notice: Subject to any disclaimer, the term of this patent is extended or adjusted under 35 U.S.C. 154(b) by 0 days.

(21) Appl. No.: 16/008,448

(22) Filed: Jun. 14, 2018

(65) Prior Publication Data

US 2018/0302033 A1 Oct. 18, 2018

Related U.S. Application Data

(63) Continuation of application No. PCT/JP2016/088384, filed on Dec. 22, 2016.

(30) Foreign Application Priority Data

Dec. 24, 2015 (JP) .................................. 2015-252121

(51) Int. Cl.
*H03B 5/04* (2006.01)
*H03L 1/02* (2006.01)
(Continued)

(52) U.S. Cl.
CPC ............... *H03B 5/04* (2013.01); *H03B 5/32* (2013.01); *H03H 3/02* (2013.01);
(Continued)

(58) Field of Classification Search
CPC ..... H03B 5/1847; H03B 5/11203; H03L 1/04; H03H 9/08; H03H 9/05; H03H 3/02; H03H 9/02; H03H 9/10; H03H 9/19
(Continued)

(56) References Cited

U.S. PATENT DOCUMENTS 9,241,418 B2 1/2016 Ishikawa et al.
9,287,881 B2 3/2016 Shimodaira et al.
(Continued)

FOREIGN PATENT DOCUMENTS

JP 2007214739 A 8/2007
JP 2007266828 A 10/2007
(Continued)

OTHER PUBLICATIONS

International Search Report issued in International Application No. PCT/JP2016/088384, dated Mar. 21, 2017.
Written Opinion of the International Searching Authority issued in International Application No. PCT/JP2016/088384, dated Mar. 21, 2017.

*Primary Examiner* — Arnold M Kinkead
(74) *Attorney, Agent, or Firm* — Arent Fox LLP

(57) ABSTRACT

A piezoelectric oscillation device includes a piezoelectric vibration element, a heating element that heats the piezoelectric vibration element, an electronic component that is electrically connected to the piezoelectric vibration element, a substrate on which the piezoelectric vibrator, the heating element, and the electronic component are mounted, and a base member to which the substrate is attached with a prescribed spacing therebetween via a substrate holding member. The substrate holding member includes a conductive part. The conductive part has a lower thermal conductivity than metal.

18 Claims, 10 Drawing Sheets

(51) Int. Cl.
*H03H 9/05* (2006.01)
*H03H 9/08* (2006.01)
*H03L 1/04* (2006.01)
*H03B 5/32* (2006.01)
*H03H 3/02* (2006.01)
*H03H 9/02* (2006.01)
*H03H 9/10* (2006.01)
*H03H 9/19* (2006.01)

(52) U.S. Cl.
CPC .... *H03H 9/02023* (2013.01); *H03H 9/02086* (2013.01); *H03H 9/02102* (2013.01); *H03H 9/0504* (2013.01); *H03H 9/0509* (2013.01); *H03H 9/0552* (2013.01); *H03H 9/08* (2013.01); *H03H 9/1021* (2013.01); *H03H 9/19* (2013.01); *H03L 1/028* (2013.01); *H03L 1/04* (2013.01); *H03H 2003/022* (2013.01)

(58) Field of Classification Search
USPC ...................... 331/176, 69, 68, 158; 310/343
See application file for complete search history.

(56) References Cited

U.S. PATENT DOCUMENTS

| | | |
|---|---|---|
| 9,800,224 B2 | 10/2017 | Shimodaira et al. |
| 2009/0051447 A1* | 2/2009 | McCracken ............ H03B 5/04 331/70 |
| 2013/0314169 A1 | 11/2013 | Tokuhashi |
| 2013/0342980 A1 | 12/2013 | Ishikawa et al. |
| 2014/0292422 A1 | 10/2014 | Kondo |
| 2014/0368283 A1 | 12/2014 | Shimodaira et al. |
| 2015/0180445 A1* | 6/2015 | Isohata ............. H03H 9/02102 331/70 |
| 2015/0180481 A1 | 6/2015 | Isohata |
| 2016/0156330 A1 | 6/2016 | Shimodaira et al. |

FOREIGN PATENT DOCUMENTS

| | | |
|---|---|---|
| JP | 2010183227 A | 8/2010 |
| JP | 2014003553 A | 1/2014 |
| JP | 2015002363 A | 1/2015 |
| JP | 2015080082 A | 4/2015 |
| JP | 2015186251 A | 10/2015 |

* cited by examiner

PIEZOELECTRIC OSCILLATION DEVICE AND MANUFACTURING METHOD THEREFOR

CROSS REFERENCE TO RELATED APPLICATIONS

The present application is a continuation of International application No. PCT/JP2016/088384, filed Dec. 22, 2016, which claims priority to Japanese Patent Application No. 2015-252121, filed Dec. 24, 2015, the entire contents of each of which are incorporated herein by reference.

TECHNICAL FIELD

The present invention relates to a piezoelectric oscillation device and a manufacturing method therefor.

BACKGROUND ART

As one form of a piezoelectric oscillation device, a thermostatic-chamber-type piezoelectric oscillation device is known that is provided with a thermostatic function and as a result the temperature of a piezoelectric vibrator is maintained constant and high frequency stability is thus realized. For example, Japanese Unexamined Patent Application Publication No. 2015-80082 discloses a thermostatic-chamber-equipped piezoelectric oscillator that includes a base plate member, a printed substrate part, a piezoelectric vibrator that is provided on the printed substrate part, a heater unit that is provided on the printed substrate part, a plurality of electronic elements that are provided on the printed substrate part, and a cover. The piezoelectric vibrator is provided with a piezoelectric vibration element that includes a piezoelectric plate and excitation electrodes that are formed on the piezoelectric plate. In the thus-configured piezoelectric oscillator, the printed substrate, on which the piezoelectric vibrator is provided, is held at a prescribed spacing from the base plate member via a plurality of connection pins.

In the above-described configuration, the connection pins that are provided between the printed substrate part and the base plate member are formed of metal and have a comparatively high thermal conductivity, and heat from the heater unit provided on the printed substrate is readily transferred to the base plate member via the plurality of connection pins. Consequently, there has been a problem in that a large amount of heat and power consumption is necessary in order to maintain the piezoelectric vibration element inside the piezoelectric vibrator in a prescribed temperature state.

The present invention was made in light of the above-described circumstances and it is an object thereof to provide a piezoelectric oscillation device that can efficiently heat a piezoelectric vibration element and can reduce power consumption. A further object of the invention is to provide a method of manufacturing the piezoelectric oscillation device.

BRIEF DESCRIPTION OF THE INVENTION

A piezoelectric oscillation device according to an aspect of the present invention includes: a piezoelectric vibrator that includes a piezoelectric vibration element; a heating element that heats the piezoelectric vibration element; an electronic component that is electrically connected to the piezoelectric vibration element; a substrate on which the piezoelectric vibrator, the heating element, and the electronic component are mounted; and a base member to which the substrate is attached with a prescribed spacing therebetween via a substrate holding member. The substrate holding member includes a conductive part having a lower thermal conductivity than metal.

According to this configuration, the substrate on which the heating element is provided is held above the base member by the substrate holding member that includes the conductive part having a lower thermal conductivity than metal. Therefore, the amount of heat, out of the heat generated by the heating element, that is radiated to the outside via the substrate holding member can be suppressed. Therefore, a piezoelectric oscillation device can be provided that can efficiently heat the piezoelectric vibration element and reduce power consumption.

A method of manufacturing a piezoelectric oscillation device according to another aspect of the present invention includes: (a) mounting, on a substrate, a piezoelectric vibrator that includes a piezoelectric vibration element, a heating element that heats the piezoelectric vibration element, and an electronic component that is electrically connected to the piezoelectric vibration element; (b) forming a substrate holding member that is for holding the substrate on the base member; and (c) attaching the substrate to the base member with a prescribed spacing therebetween via the substrate holding member. The substrate holding member includes a conductive part, and in (b), the conductive part is formed of a material having a lower thermal conductivity than metal.

According to this configuration, the substrate on which the heating element is provided is held above the base member by the substrate holding member that includes the conductive part having a lower thermal conductivity than a metal connection pin. Therefore, the amount of heat, out of the heat generated by the heating element, that is radiated to the outside via the substrate holding member can be suppressed. Therefore, a method of manufacturing a piezoelectric oscillation device can be provided that can efficiently heat the piezoelectric vibration element and reduce power consumption.

According to the present invention, a piezoelectric oscillation device can be provided that can efficiently heat the piezoelectric vibration element and reduce power consumption, and a method of manufacturing the piezoelectric oscillation device can be provided.

DETAILED DESCRIPTION OF THE PREFERRED EMBODIMENTS

Hereafter, embodiments of the present invention will be described. In the following description of the drawings, identical or similar constituent elements are denoted by identical or similar symbols. The drawings are representative, the dimensions and shapes of the individual parts are schematically illustrated, and the technical scope of the invention of the present application should not be interpreted as being limited to that of the embodiments.

Figure 1:
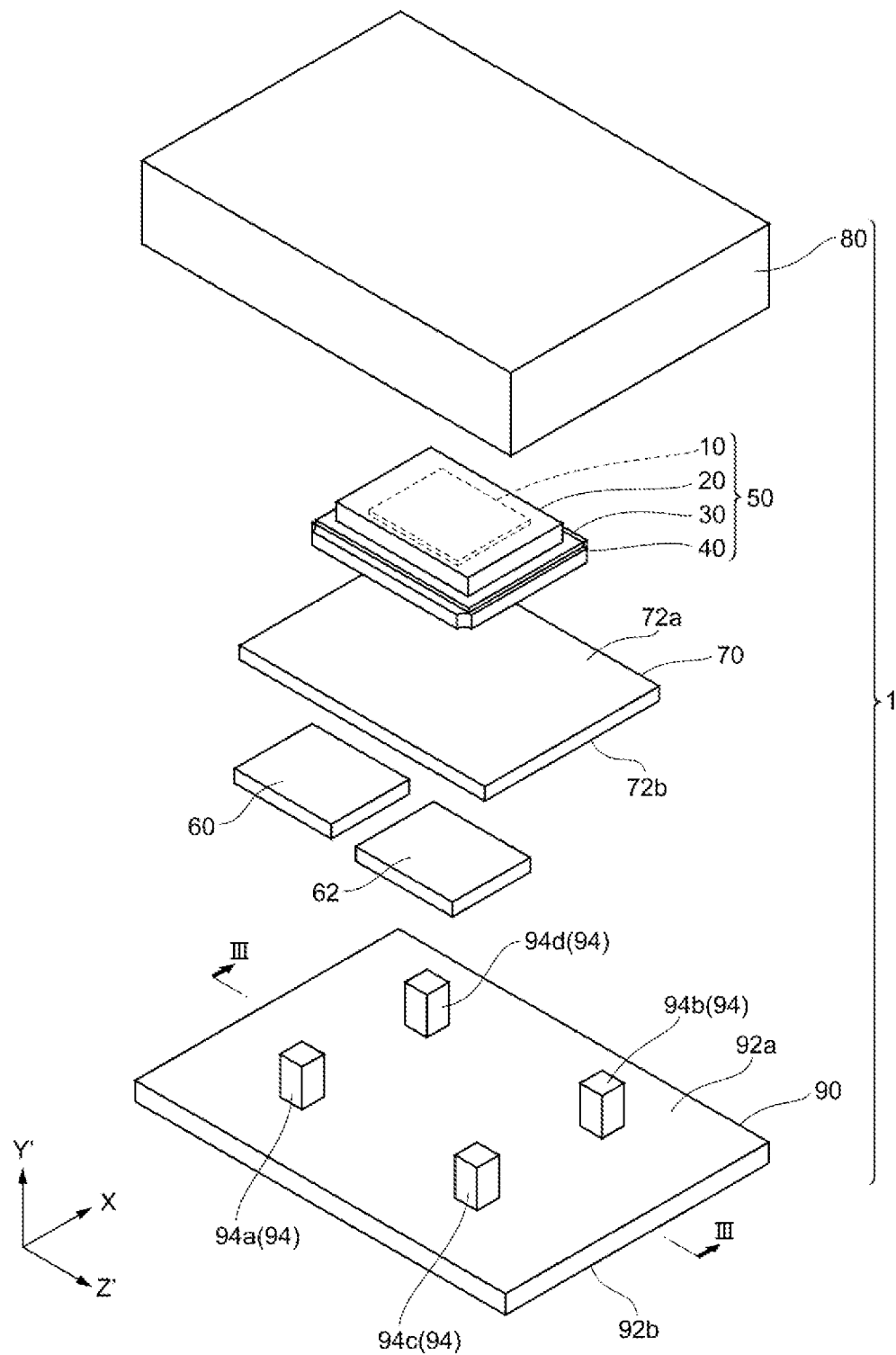
FIG. 1 is an exploded perspective view of a piezoelectric oscillation device according to an embodiment of the present invention.
Figure 2:
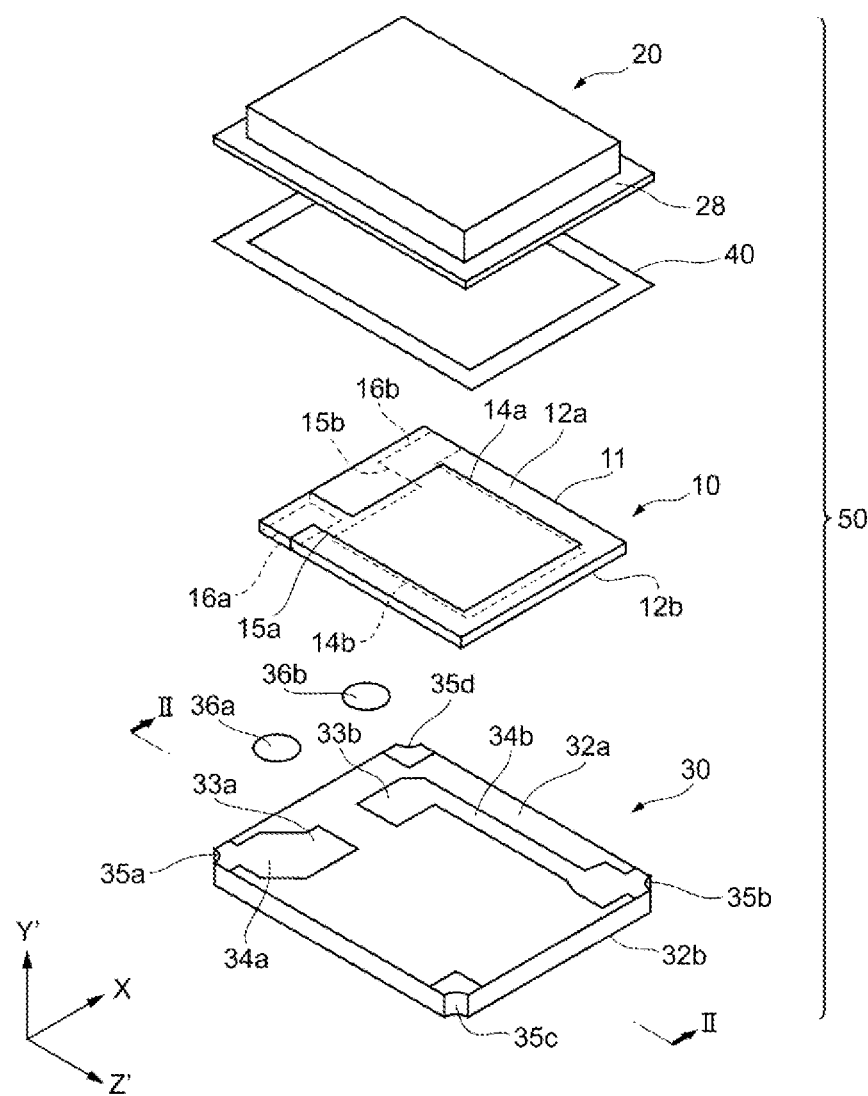
FIG. 2 is an exploded perspective view of the piezoelectric oscillation device according to the embodiment of the present invention.
Figure 3:
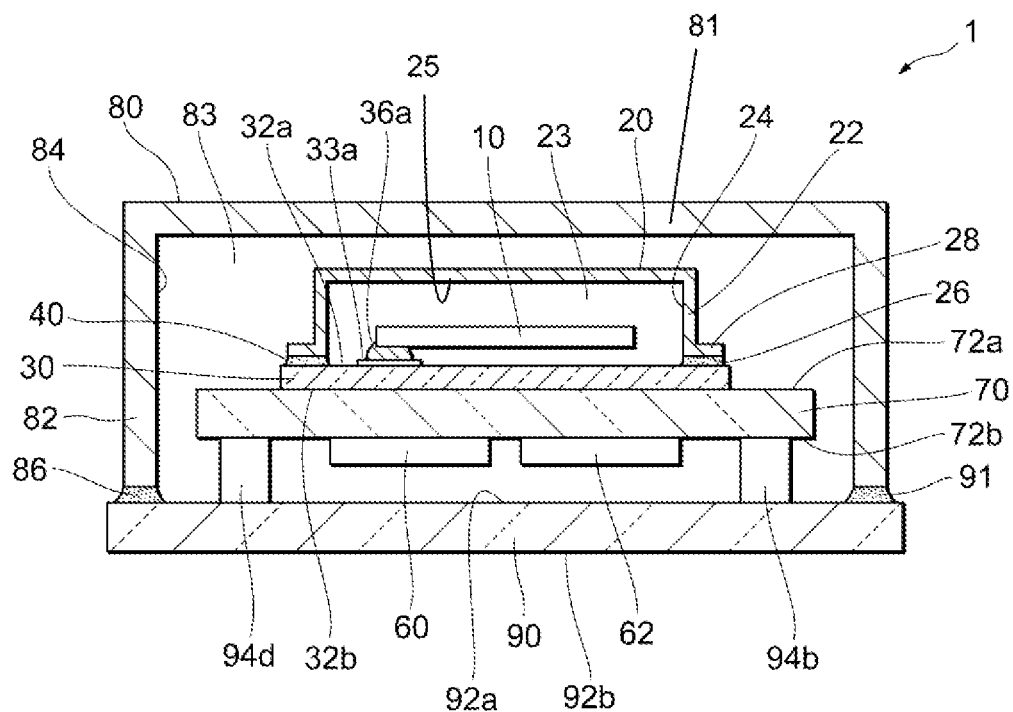
FIG. 3 is a sectional view taken along line III-III in FIG. 1.
Figure 4A:
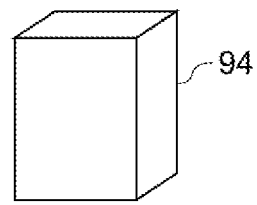
FIGS. 4A-4F are diagrams for explaining various embodiments of a substrate holding member for use in the piezoelectric oscillation device according to embodiments of the present invention.

A piezoelectric oscillation device according to an embodiment of the present invention will be described while referring to FIGS. 1 to 5. FIG. 1 is an exploded perspective view of the piezoelectric oscillation device, FIG. 2 is an exploded perspective view of a piezoelectric vibrator that is part of the piezoelectric oscillation device in FIG. 1, and FIG. 3 is a sectional view taken along line III-III in FIG. 1. FIGS. 4 and 5 are diagrams for explaining a substrate holding member of the piezoelectric oscillation device.

As illustrated in FIG. 1, a piezoelectric oscillation device 1 according to this embodiment includes a piezoelectric vibrator 50, a heating element 60, an electronic component 62, a substrate 70 on which prescribed electrodes (not illustrated) are formed, a lid member 80, a base member 90, and substrate holding members 94. The piezoelectric vibrator 50 is mounted on one main surface of the substrate 70 and the heating element 60, which is for heating the piezoelectric vibrator 50, and the electronic component 62, which is electrically connected to the piezoelectric vibrator 50, are mounted on the other main surface of the substrate 70. The substrate 70 is attached to the base member 90 with a prescribed spacing therebetween via the substrate holding members 94. The lid member 80 is attached to the base member 90 and the piezoelectric vibrator 50 and the substrate 70 are housed inside the thus created space. In other words, the lid member 80 and the base member 90 serve as a case or package for housing the piezoelectric vibrator 50, the heating element 60, and the electronic component 62. Hereafter, the individual constituent elements will be specifically described.

As illustrated in FIG. 2, the piezoelectric vibrator 50 according to this embodiment includes a piezoelectric vibration element 10, a cap 20, which is an example of a lid member, and a substrate 30, which is an example of a base member. The cap 20 and the substrate 30 form a case or package having an internal space for housing the piezoelectric vibration element 10.

The piezoelectric vibration element 10 includes a piezoelectric plate (a piezoelectric substrate) 11, and first and second excitation electrodes 14a and 14b that are formed on the piezoelectric plate 11. The first excitation electrode 14a is formed on a first surface 12a, which is a main surface, of the piezoelectric plate 11, and the second excitation electrode 14b is formed on a second surface 12b, which is a main surface, of the piezoelectric plate 11 on the opposite side from the first surface 12a of the piezoelectric plate 11.

The piezoelectric plate 11 is formed of piezoelectric material. The particular piezoelectric material is not especially limited. In the example illustrated in FIG. 2, the piezoelectric plate 11 is an AT-cut crystal piece. In this case, the piezoelectric vibration element 10 is a crystal vibration element. In addition, the piezoelectric vibrator 50 is a crystal vibrator. An AT-cut crystal substrate is obtained by performing cutting such that main surfaces of the crystal substrate are surfaces that are parallel to a plane defined by an X axis and a Z' axis (Hereafter, referred to as an "XZ' plane". Similar definitions are used for planes specified using the other axes), where among an X axis, a Y axis, and a Z axis, which are the crystallographic axes of an artificial crystal, a Y' axis and a Z' axis are axes that are respectively obtained by rotating the Y axis and the Z axis 35° 15'±1° 30' around the X axis in a direction from the Y axis toward the Z axis. In the example illustrated in FIG. 2, the piezoelectric plate 11, which is an AT cut crystal substrate, has long sides that are parallel to the Z' axis, short sides that are parallel to the X axis, and a thickness direction that is parallel to the Y' axis direction, and has a rectangular shape in the XZ' plane. A crystal vibrator, in which an AT-cut crystal substrate is employed, has high frequency stability over a wide temperature range, has excellent degradation with time characteristics, and can be manufactured at a low cost. A thickness shear mode is used as a main vibration in an AT-cut crystal vibrator.

The piezoelectric plate according to this embodiment is not limited to this configuration. For example, an AT-cut crystal substrate having a longitudinal direction that is parallel to the X axis direction and a lateral direction that is parallel to the Z' axis direction may be adopted. Alternatively, a crystal substrate having a cut other than an AT cut (for example, BT cut or the like) may be adopted, or another piezoelectric material other than a crystal such as a ceramic may be adopted.

The first excitation electrode 14a is formed on the first surface 12a of the piezoelectric plate 11 (XZ' plane on positive Y' axis direction side), and the second excitation electrode 14b is formed on the second surface 12b (XZ' plane on negative Y' axis direction side) of the piezoelectric plate 11, which is on the opposite side from the first surface 12a of the piezoelectric plate 11. The first and second excitation electrodes 14a and 14b constitute a pair of electrodes and have parts that overlap each other with the piezoelectric plate 11 interposed therebetween in a plan view of the XZ' plane. The excitation electrodes 14a and 14b may each have a rectangular shape in the XZ' plane. In this case, the longitudinal directions of the excitation electrodes 14a and 14b may be arranged in a direction so as to match the longitudinal direction of the piezoelectric plate 11.

A connection electrode 16a, which is electrically connected to the first excitation electrode 14a via an extension electrode 15a, and a connection electrode 16b, which is electrically connected to the second excitation electrode 14b via an extension electrode 15b, are formed on the piezoelectric plate 11. Specifically, the extension electrode 15a extends from the first excitation electrode 14a toward the short edge on the negative Z' axis direction side on the first surface 12a, passes over the side surface of the piezoelectric plate 11 on the negative Z' axis direction side, and is connected to the connection electrode 16a, which is formed on the second surface 12b. On the other hand, the extension electrode 15b extends from the second excitation electrode 14b toward the short edge on the negative Z' axis direction side on the second surface 12b, and is connected to the connection electrode 16b, which is formed on the second surface 12b. The connection electrodes 16a and 16b are arranged along the short edge on the negative Z' axis direction side, and the connection electrodes 16a and 16b are electrically connected to the substrate 30 and are mechanically held on the substrate 30 via electrically conductive holding members 36a and 36b, which are described later. In this embodiment, the arrangements and pattern shapes of the connection electrodes 16a and 16b and the extension electrodes 15a and 15b are not restricted, and may be changed as appropriate while considering electrical connections to other members.

The above-mentioned electrodes including the first and second excitation electrodes 14a and 14b may be formed for example by forming a chromium (Cr) layer as a base and then forming a gold (Au) layer on the surface of the chromium layer. The materials of the electrodes are not limited to those in the embodiments.

As illustrated in FIG. 3, the cap 20 has a recess 24 that opens so as to face a first surface 32a of the substrate 30. The recess 24 is provided with a side wall 22, which extends around the periphery of the cap 20 and extends perpendicular to a bottom surface 25 of the recess 24. In addition, the cap 20 has an attachment surface 26, which faces the first surface 32a of the substrate 30, provided along the edge of the opening of the recess 24. The cap 20 may have a flange portion 28 that protrudes outwardly from the distal end of the side wall 22. In this case the attachment surface 26 is formed on the flange portion 28. In this way, the bonding area between the cap 20 and the substrate 30 can be increased by bonding the attachment portion 28 and the substrate 30 to each other using an appropriate binding material 40. Therefore the strength of the bond between the cap 20 and the substrate 30 can be improved.

There are no particular restrictions on the shape of the cap 20 and, for example, the cap 20 may not have the flange portion 28 and the attachment portion 28 may be the distal face of the side wall 22.

There are no particular restrictions on the material of the cap 20, and for example, the cap 20 may be formed of a conductive material such as a metal. With this configuration, a superior electromagnetic shielding function can be added by electrically connecting the cap 20 to the ground potential. Alternatively, the cap 20 may be composed of an insulating material or may have a composite structure composed of a conductive material and an insulating material.

As illustrated in FIG. 2, the piezoelectric vibration element 10 is mounted on the first surface 32a (an upper surface as viewed in FIG. 2) of the substrate 30. In the example illustrated in FIG. 2, the substrate 30 has a longitudinal direction that is parallel to the Z' axis direction, a lateral direction that is parallel to the X axis direction, and a thickness direction that is parallel to the Y' axis direction, and has a rectangular shape in the XZ' plane. The substrate 30 may be formed, for example, of an insulating ceramic. Alternatively, the substrate 30 may be formed of a glass material, a crystal material, a glass epoxy resin, or the like. The substrate 30 may be formed of one or more layers when the substrate 30 is formed of a plurality of layers, an insulating layer may be included that is formed as the outermost layer at the first surface 32a. In addition, the substrate 30 may be shaped like a flat plate or may have a recessed shape that opens so as to face the cap 20. As illustrated in FIG. 3, the piezoelectric vibration element 10 is preferably hermetically sealed inside an inner space (cavity) 23 that is surrounded by the recess 24 of the cap 20 and the substrate 30 by bonding the cap 20 and the substrate 30 to each other via the bonding material 40.

The bonding material 40 is preferably provided along the entire periphery of the cap 20 or the substrate 30, and is interposed between the facing surface 26 of the side wall portion 22 of the cap 20 and the first surface 32a of the substrate 30. The bonding material 40 may be composed of an insulating material. The insulating material may, for example, be a glass material (for example, a low-melting-point glass) or a resin material (for example, an epoxy-based resin). As a result of using such an insulating material, compared with metal bonding, the heating temperature can be suppressed and the manufacturing facility can be simplified. In the case where an electromagnetic shielding function of the cap 20 is to be improved, it is preferable that the cap 20 be bonded to the substrate 30 via the bonding material 40 while securing an electrical connection to the cap 20.

In the example illustrated in FIG. 3, one end of the piezoelectric vibration element 10 (end portion on electrically conductive holding members 36a and 36b side) is a fixed end and the other end of the piezoelectric vibration element 10 is a free end. As a modification, the piezoelectric vibration element 10 may be fixed to the substrate 30 at both ends thereof in the longitudinal direction.

As illustrated in FIG. 2, the substrate 30 includes connection electrodes 33a and 33b that are formed on the first surface 32a, and extension electrodes 34a and 34b that extend from the connection electrodes 33a and 33b toward the outer edge of the first surface 32a. The extension electrodes 34a and 34b are arranged inside from the outer edge of the substrate 30 such that the piezoelectric vibration element 10 can be arranged substantially in the center of the first surface 32a of the substrate 30.

The connection electrode 16a of the piezoelectric vibration element 10 is connected to the connection electrode 33a via the electrically conductive holding member 36a, and the connection electrode 16b of the piezoelectric vibration element 10 is connected to the connection electrode 33b via the electrically conductive holding member 36b.

The extension electrode 34a extends from the connection electrode 33a toward any one corner of the substrate 30, and the extension electrode 34b extends from the connection electrode 33b toward another one corner of the substrate 30. In addition, a plurality of outer electrodes 35a, 35b, 35c, and 35d are formed at the corners of the substrate 30, and in the example illustrated in FIG. 2, the extension electrode 34a is connected to the outer electrode 35a formed in the corner that is on the negative X axis direction side and negative Z' axis direction side, and the extension electrode 34b is connected to the outer electrode 35b formed in the corner on the positive X axis direction side and the positive Z' axis direction side. In addition, as illustrated in FIG. 2, the outer electrodes 35c and 35d may be formed in the remaining corners. Furthermore, these outer electrodes may be dummy electrodes that are not electrically connected to the excitation electrodes of the piezoelectric vibration element 10. In addition, these outer electrodes may be dummy electrodes that are not electrically connected to an electronic component mounted on the substrate 30. As a result of such dummy electrodes being formed, the process of applying a conductive material for forming the outer electrodes is simplified and outer electrodes can be formed in all the corners, and therefore the processing step of bonding the piezoelectric vibrator to another member is also simplified. In addition, ground electrodes to which a ground potential is supplied may be formed instead of the outer electrodes 35c and 35d, which are dummy electrodes. In the case where the cap 20 is composed of an electrically conductive material, a superior electromagnetic shielding function may be added to the cap 20 by connecting the cap 20 to the outer electrodes 35c and 35d, which are at the ground potential.

In the example illustrated in FIG. 2, the corners of the substrate 30 each have a cut-away side surface formed by cutting away part of the corner to form a cylindrical curved surface shape (also referred to as castellation shape), and the outer electrodes 35a to 35d are formed in a continuous manner on these cut-away side surfaces and a second surface 32b of the substrate 30. The shape of the corners of the substrate 30 is not limited to this example, and the cut-away shape may be a flat surface shape or the corners may not be cut away and the four corners may instead have a right-angle rectangular shapes in plan view.

The configurations of the connection electrodes, the extension electrodes, and outer electrodes of the substrate 30 are not limited to the above-described examples, and can be modified in various ways. For example, the connection electrodes 33a and 33b may be formed on different sides from each other on the first surface 32a of the substrate 30 such as one connection electrode being formed on the positive Z' axis direction side and the other connection electrode being formed on the negative Z' axis direction side. In this configuration, the piezoelectric vibration element 10 is supported on the substrate 30 at both one end and the other end thereof in the longitudinal direction. In addition, the number of outer electrodes is not limited to four, and a similar effect is obtained even if there are only two outer electrodes arranged at diagonally opposite corners. Furthermore, the outer electrodes are not limited to being arranged in the corners, and one or more outer electrodes may instead be formed on any parts of the side surfaces of the substrate 30 excluding the corners. In this case, as has already been described, cut-away side surfaces may be formed by cutting away parts of the side surfaces to form cylindrical curved surface shapes, and the outer electrodes may be formed on these parts of the side surfaces excluding the corners. In addition, the other electrodes 35c and 35d, which are dummy electrodes, do not have to be formed. Furthermore, through holes that penetrate from the first surface 32a to the second surface 32b may be formed in the substrate 30, and electrical connections from connection electrodes formed on the first surface 32a to the second surface 32b may be realized using the through holes.

In the piezoelectric vibrator 50 illustrated in FIG. 2, an alternating-current voltage is applied between the pair of first and second excitation electrodes 14a and 14b of the piezoelectric vibration element 10 via the outer electrodes 35a and 35b of the substrate 30, and as a result the piezoelectric substrate 11 vibrates in a prescribed vibration mode such as a thickness shear vibration mode, and resonance characteristics are obtained together with the vibration.

Returning to FIG. 1, the other constituent elements of the piezoelectric oscillation device 1 will now be described.

In the example illustrated in FIG. 1, the piezoelectric vibrator 50 is mounted on a first main surface 72a of the substrate 70, and the heating element 60 and the electronic component 62 are mounted on a second main surface 72b of the substrate 70 which is opposed to the first surface 72a. Prescribed electrodes (which are not illustrated) are formed on the substrate 70, and the piezoelectric vibrator 50, the heating element 60, and the electronic component 62 are respectively electrically connected to wiring lines of the electrodes. Furthermore, the piezoelectric vibration element 10 may be mounted on the first surface 72a, which is a main surface of the substrate 70, without using the substrate 30. In this case, the connection electrode 16a (FIG. 2) of the piezoelectric vibration element 10 is connected to a connection electrode 33a provided on the substrate 70 via the electrically conductive holding member 36a, and the connection electrode 16b of the piezoelectric vibration element 10 is connected to a connection electrode 33b provided on the substrate 70 via the electrically conductive holding member 36b.

The heating element 60 may be arranged close to the piezoelectric vibrator 50 in order to improve the effect of supplying heat to the piezoelectric vibrator 50. For example, as illustrated in FIG. 1, the heating element 60 may be provided in a region of the second surface 72b that at least partially overlaps the piezoelectric vibrator 50, the second surface 72b being the surface of the substrate 70 on the opposite side from the upper surface of the piezoelectric vibrator 50. Alternatively, as a modification, the heating element 60 may be provided close to the piezoelectric vibrator 50 on the first surface 72a of the substrate 70, which is the side of the substrate 70 on which the piezoelectric vibrator 50 is mounted.

The electronic component 62 is electrically connected to the piezoelectric vibration element 10 and forms an oscillation circuit that is for generating a reference signal such as a clock signal. The electronic component 62 is electrically connected to the piezoelectric vibrator 50 via electrodes (not illustrated) that are formed on the substrate 70 and is configured so as to be able to be electrically connected to a component outside the piezoelectric oscillation device 1 (for example, a circuit board) via electrodes (not illustrated) that are formed on the base member 90. The electronic component 62 is, for example, an integrated circuit element. The integrated circuit element may also include prescribed circuits that are necessary in order for the piezoelectric vibrator 50 to perform prescribed operations. For example, the integrated circuit element may include an oscillation circuit for generating a reference signal such as a clock signal, a temperature sensor circuit that detects the temperature of the piezoelectric vibration element 10, and a control circuit that controls the temperature sensor circuit. Although the heating element 60 is a separate constituent element from the electronic component 62 in the example illustrated in FIG. 1, as a modification, an integrated circuit element, which is an example of the electronic component 62, may further include a control circuit that controls the heating element and may further include the heating element.

One or more other electronic components (which may be active elements and/or passive elements) may be mounted on the substrate 70. In addition, various circuits built into the integrated circuit element may instead be formed as separate electronic components and these electronic components may be mounted on the first surface 72a and/or the second surface 72b of the substrate 70.

The material of the substrate 70 is not particularly limited. By way of example, an insulating ceramic can be used. Alternatively, the substrate 70 may be formed of a glass material, a crystal material, a glass epoxy resin, or the like.

As illustrated in FIG. 3, the lid member 80 is a cap and has a recess 84 that opens so as to face a first surface 72a of the substrate 70. The recess 84 is provided with a side wall 82, which extends downwardly from the entire outer periphery of a top wall 81 of the lid member 80 at a 90° angle. In addition, the lid member 80, has an attachment surface 86, which faces the first surface 72a of the substrate 70, provided along the bottom edge (as viewed in FIG. 3) of the side wall 82. In the example illustrated in FIG. 3, the attachment surface 86 is bonded to the substrate 70. Alternatively, as a modification, the lid member may have a flange portion similarly to the cap 20 of the piezoelectric vibrator 50 and the attachment surface 86 will be formed on the flange portion.

There are no particular restrictions on the material of the lid member 80, and for example, the lid member 80 may be formed of a conductive material such as a metal. With this configuration, a superior electromagnetic shielding function can be added by electrically connecting the lid member 80 to the ground potential. Alternatively, the lid member 80 may be composed of an insulating material or may have a composite structure composed of a conductive material and an insulating material.

In addition, the shape of the lid member 80 is not limited to that of the above-described cap, and provided that the lid member 80 has a configuration that allows the piezoelectric vibrator 50 to be housed thereinside when combined with the base member 90, the shape of the lid member 80 is not restricted. For example, in the case where the piezoelectric vibration element 10 is mounted on the first surface 72a of the substrate 70, the cap 20 may be bonded to the first surface 72a of the substrate 70 and the lid member 80 may be bonded to the base member 90 such that the piezoelectric vibration element 10 is housed inside the recess 24 of the cap 20.

The substrate 70 is held on a first surface 92a of the base member 90, which is a main surface of the base member 90. Specifically, one or more substrate holding members 94 (four substrate holding members 94a, 94b, 94c, and 94d in the example illustrated in FIG. 1) are provided on the first surface 92a of the base member 90 and these substrate holding members 94 support the second surface 72b of the substrate 70 at a position that is a prescribed spacing from the base member 90. Electrodes (not illustrated), which are for realizing electrical connections to a location outside the piezoelectric oscillation device 1, are formed on the base member 90. Electrodes for realizing electrical connections to the outside such as to a circuit board (which is not illustrated) may be formed on a second surface 92b of the base member 90, which is on the opposite side from the first surface 92a of the base member 90.

The material of the base member 90 is not particularly limited, and the base member 90 may be formed, for example, of an insulating ceramic. Alternatively, the base member 90 may be formed of a glass material, a crystal material, a glass epoxy resin, or the like. The shape of the base member 90 is also not particularly limited, and for example, the base member 90 may have a flat plate shape, as illustrated in FIG. 1, or may have a recessed shape that opens so as to face the lid member 80.

As illustrated in FIG. 3, the lid member 80 and the base member 90 are bonded to each other via a bonding material 91 and as a result the piezoelectric vibrator 50, the heating element 60, and the electronic component 62 are hermetically sealed in an inner space (cavity) 83 that is surrounded by the recess 84 of the lid member 80 and the base member 90. In addition, a suitable material can be chosen for the bonding material 91 in line with the materials of the lid member 80 and the base member 90, and for example, the content described in relation to the bonding material 40 of the piezoelectric vibrator 50 can be applied.

Next, various substrate holding members which can be used with this embodiment will be further described while referring to FIG. 1, FIGS. 4A to 4F, and FIG. 5.

The substrate holding member 94 preferably includes a conductive part. The conductive part is electrically connected to at least one out of the piezoelectric vibrator 50, the heating element 60, and the electronic component 62 mounted on the substrate 70, and is for electrically connecting any of these elements to a location outside the piezoelectric oscillation device. The conductive part of the substrate holding member 94 preferably has a lower thermal conductivity than metal. Therefore, the amount of heat, out of the heat generated by the heating element 60, that is radiated to the outside via the substrate holding member 94 can be suppressed, the piezoelectric vibration element 10 can be efficiently heated, and power consumption can be reduced.

The conductive part of the substrate holding member 94 is preferably composed of an epoxy-based conductive resin material. The epoxy-based conductive resin material is a composite material in which a conductive filler such as silver is contained in an epoxy-based resin serving as a binder, and the entirety of this composite material functions as the conductive part. The thermal conductivity of the epoxy-based conductive resin material is 5.0 W/(m·K). This value is lower than the thermal conductivity of a single metal (for example, the thermal conductivity of copper is 400 W/(m·K)) or an alloy (for example, the thermal conductivity of nickel silver is 40 W/(m·K)). The conductive part of the substrate holding member 94 is not limited to being composed of an epoxy-based conductive resin material and may be composed of another type of conductive resin material.

In the example illustrated in FIG. 1, the entirety of each substrate holding member 94 is formed of the conductive part. However, this is not required. For example, a portion of each substrate holding member 94 may be formed of the conductive part, as described later.

As illustrated in FIG. 1, the substrate holding members 94 may be columnar bodies. In this case, the conductive part is exposed at both the side of the columnar body that faces the substrate 70 and the side of the columnar body that faces the base member 90. In addition, the columnar body may have flat side surfaces and/or a curved side surface. As illustrated in FIG. 1, the height of the substrate holding members 94 in the Y' direction (for example, average height) is larger than the width of the substrate holding members 94 in the XZ' plane (for example, average width). In the case where the substrate holding members 94 have a circular shape in the XZ' plane, the height of the substrate holding members 94 in the Y' direction (for example, average height) is larger than the diameter of the substrate holding members 94 in the XZ' plane (for example, average diameter). Thus, provided that the substrate holding members 94 having a long thin shape in which the cross-sectional width in the XZ' plane is smaller than the height in the Y' direction, the amount of heat transmitted via the substrate holding members 94 can be reduced. In addition, the "diameter of a substrate holding member" may be the diameter of a circumscribing circle of the substrate holding member in a plane contacting the XZ' plane.

The substrate holding members may have any of various shapes. For example, as illustrated in FIG. 4A, the substrate holding members 94 may have a prism-like shape in which the side surfaces of the columnar body be flat. The cross-sectional shape of the prism-like shape may be a polygon such as a rectangle.

Figure 4B:
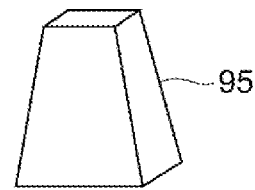
Figure 4C:
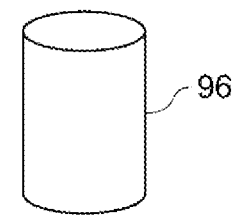
Figure 4D:
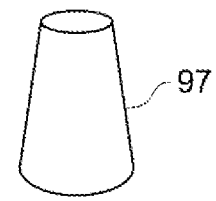
Figure 4E:
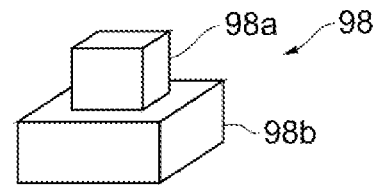
Figure 4F:
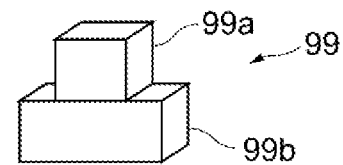
Figure 5:
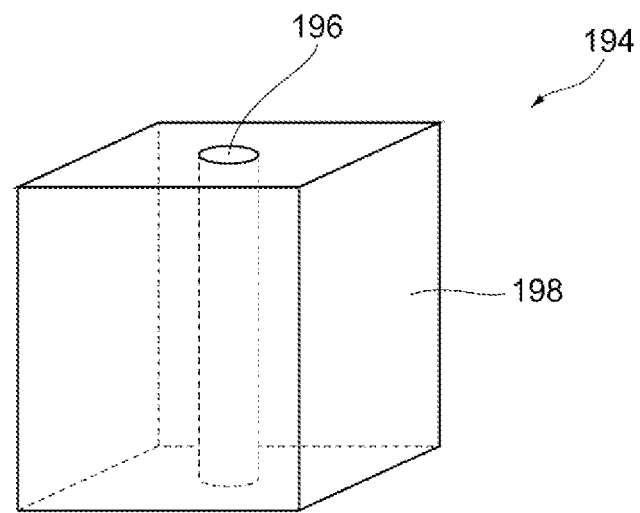
FIG. 5 is a diagram illustrating a modification of a substrate holding member of a piezoelectric oscillation device according to an embodiment of the present invention.

Alternatively, as illustrated in FIG. 4B, a substrate holding member 95 may be adopted that has a square truncated pyramid shape as one example of a truncated pyramid shape. In this case, the shape may be a shape in which the cross-sectional width becomes smaller toward the substrate 70 and specifically the shape may be a tapered shape. In other words, the side surfaces of the substrate holding member 95 may be tapered surfaces. Alternatively, as illustrated in FIG. 4C, a substrate holding member 96 having a cylindrical shape may be adopted. Alternatively, as illustrated in FIG. 4D, a substrate holding member 97 having a truncated cone shape may be adopted. Alternatively, a substrate holding member may be formed by combining a plurality of three-dimensional shapes, as illustrated in FIGS. 4E and 4F. For example, as illustrated in FIG. 4E, a substrate holding member 98 may be adopted that includes a first part 98a having a prism-like shape and a second part 98b having a prism-like shape and having a larger cross-sectional width than the first part 98a. In this case, the part having the larger cross-sectional width may be arranged on the base member 90 side. In addition, as illustrated in FIG. 4F, a substrate holding member 99 may be adopted that includes a square-column-shaped first part 99a and a square-column-shaped second part 99b that has a larger cross-sectional width than the first part 99a, and in which opposite side surfaces of the first and second parts 99a and 99b are formed so as to be respectively flush with one another.

In the case where the substrate holding member has a shape in which the cross-sectional width varies in the height direction, provided that the shape is a shape in which the cross-sectional width becomes smaller toward the substrate 70, which is the side on which the heating element 60 is provided, the amount of heat that is transmitted from the heating element 60 to the base member 90 via the substrate 70 can be made small. Therefore, the efficiency with which the piezoelectric vibration element 10 is heated is improved. Alternatively, the cross-sectional width of the substrate holding member may become smaller toward the base member 90 on the opposite side, or the substrate holding member may have a shape in which the cross-sectional width is smaller in the center than at the ends in the height direction. Since the amount of heat that is transmitted through the substrate holding member and radiated to the outside depends on the size of the cross-sectional width of the substrate holding member (in other words, the cross-sectional area), it is possible to reduce the amount of heat that is radiated to the outside due to the presence of a part having a relatively small cross-sectional width.

Although examples are illustrated in FIGS. 1 and 4 in which the entirety of the substrate holding member is formed of a conductive part, as a modification, a substrate holding member 194 may have a conductive part 196 and a covering part 198 that covers the conductive part 196, as illustrated in FIG. 5. In this case, the conductive part 196 is exposed from the covering part 198 on the side facing the substrate 70 and the side facing the base member 90. In addition, the covering part 198 has a lower thermal conductivity than the conductive part 196. The covering part 198 may be formed of an insulating resin material or may be formed of an organic or inorganic composite material. Examples of a material constituting the covering part 198 include an epoxy resin, an acrylic resin, and a glass epoxy material. The content described for the case where the entirety of the substrate holding member is formed of the conductive part applies to the rest of the configuration. According to the configuration illustrated in FIG. 5, the amount of heat radiated to the outside via the substrate holding member 194 can be further suppressed compared with the case where the entirety of the substrate holding member 194 is formed of the conductive part.

Figure 6:
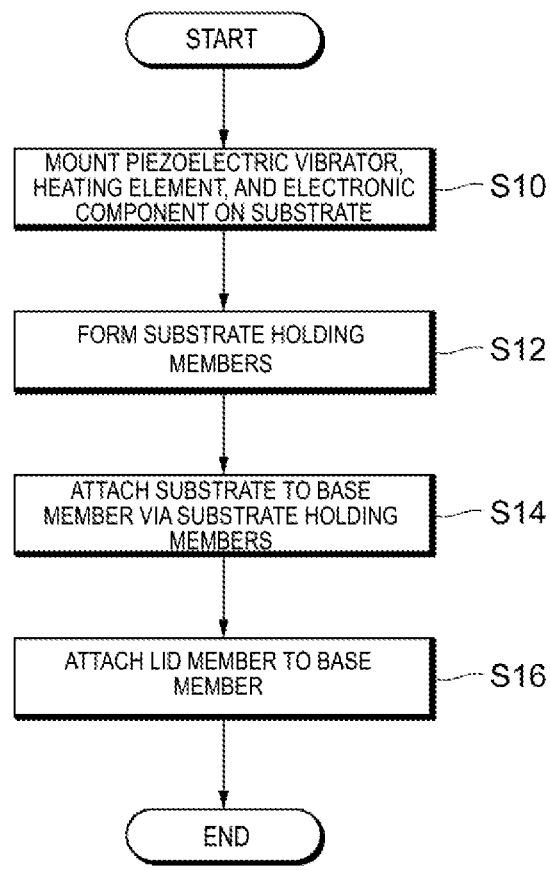
FIG. 6 is a flowchart for explaining a method of manufacturing a piezoelectric oscillation device according to an embodiment of the present invention.

Next, a method of manufacturing the piezoelectric oscillation device according to this embodiment will be described while referring to FIGS. 6 to 9. FIG. 6 is a flowchart illustrating a method of manufacturing the piezoelectric oscillation device according to an embodiment of the invention. Furthermore, FIGS. 7A to 7F are diagrams illustrating an example of a method of forming a substrate holding member and FIGS. 8 and 9 are diagrams illustrating a modification of the method of forming a substrate holding member.

As illustrated in FIG. 6, the piezoelectric vibrator 50, the heating element 60, and the electronic component 62 are prepared and then mounted on the substrate 70 (S10). Next, the substrate holding members 94 are formed (S12). [Alternatively, the substrate holding members 94 can be formed before Step S10]. After that, the substrate 70 is attached to the base member 90 with a prescribed spacing therebetween via the substrate holding members 94 (S14). Finally, the lid member 80 is attached to the base member 90 (S16). In this way, the piezoelectric oscillation device 1 can be obtained in which the piezoelectric vibrator 50, the heating element 60, and the electronic component 62 are housed in a package formed of the lid member 80 and the base member 90.

The substrate holding members 94 can be formed using various manufacturing methods. For example, as illustrated in FIGS. 7A to 7F, a plurality of substrate holding members 94 may be formed on a sheet 100 by forming a conductive resin block 102 on the sheet 100 and then shaping and dividing the conductive resin block 102 to form the individual substrate holding members 94.

Figure 7A:
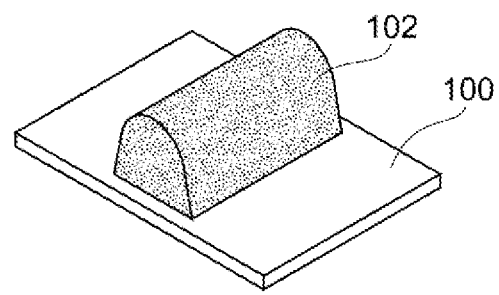
FIGS. 7A through 7F are diagrams for explaining methods of manufacturing a piezoelectric oscillation device according to embodiments of the present invention.
Figure 7B:
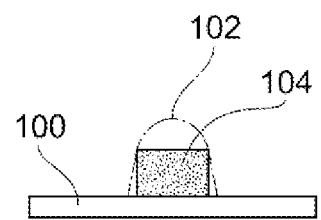
Figure 7C:
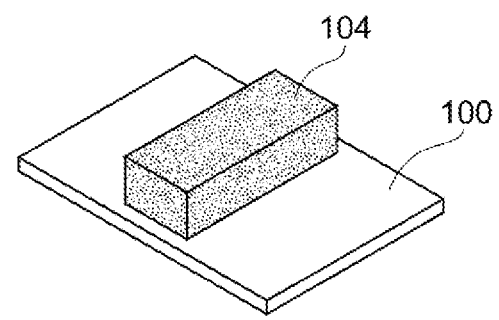
Figure 7D:
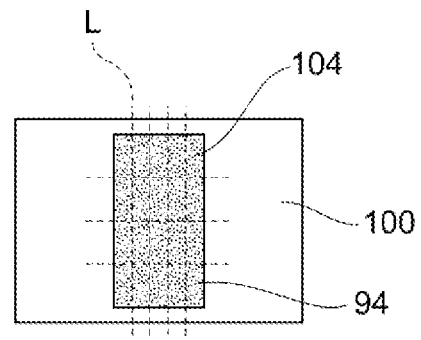
Figure 7E:
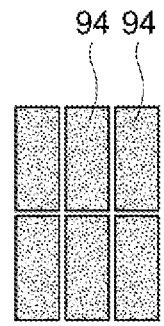
Figure 7F:
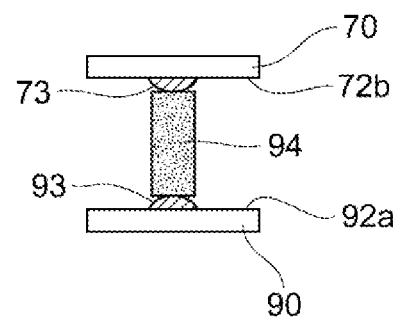

As illustrated in FIG. 7A, the conductive resin block 102 is formed by applying a conductive resin material in the form of a paste to the sheet 100, which has adhesiveness, and then curing the material using heat or the like. Next, as illustrated in FIGS. 7B and 7C, a conductive resin block 104 is obtained by subjecting the top and side surfaces of the cured conductive resin block 102 to removal machining using a dicing blade (not illustrated) in order to shape the conductive resin block 102. After that, as illustrated in FIGS. 7D and 7E, a plurality of substrate holding members 94 having a prescribed shape are obtained by cutting the conductive resin block 104 on the sheet 100 using a dicing blade in order to divide the conductive resin block 104 into the individual substrate holding members 94. Then, the plurality of substrate holding members 94 are peeled off the sheet 100. For example, the sheet 100 may have a property in which the adhesiveness thereof is decreased when subjected to heat or the like, and in such a case, the plurality of substrate holding members 94 can be easily removed from the sheet 100 by heating the sheet 100. Finally, as illustrated in FIG. 7F, the substrate holding member 94 is arranged between the second surface 72b of the substrate 70 and the first surface 92a of the base member 90 and the substrate 70 is held on the base member 90 via the substrate holding member 94. In this case, for example, conductive material 73 may be provided on the second surface 72b of the substrate 70 and conductive material 93 may be provided on the first surface 92a of the base member 90, and the conductive materials 73 and 93 may be electrically connected to the conductive part of the substrate holding member 94. The conductive materials 73 and 93 may be solder or may be a conductive adhesive material, for example. In addition, the part of the conductive part of the substrate holding member 94 where the electrical connection is to be realized may be subjected to a plating treatment in advance.

According to the manufacturing method illustrated in FIGS. 7A to 7F, a plurality of substrate holding members 94 can be efficiently manufactured using comparatively few steps. In addition, shaping processing using a dicing blade can be performed on the sheet 100, and therefore there is a high degree of freedom in the shaping processing and the shaping processing itself is simple.

Figure 8A:
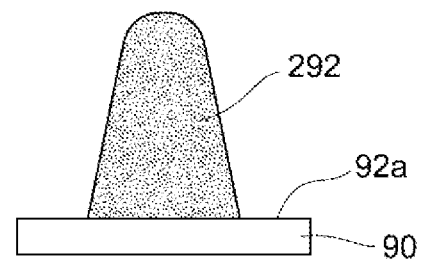
FIGS. 8A through 8C are diagrams for explaining methods of manufacturing a piezoelectric oscillation device according to an embodiment of the present invention.
Figure 8B:
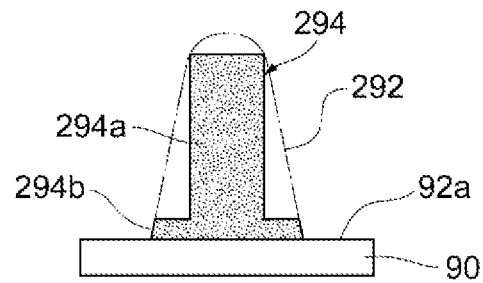
Figure 8C:
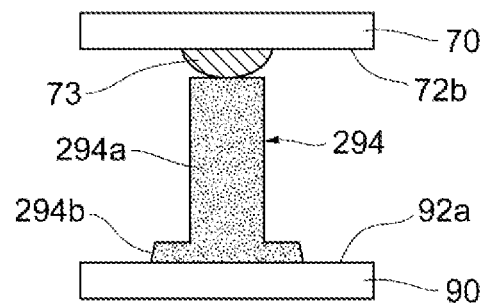

As a modification, as illustrated in FIGS. 8A to 8C, the substrate holding member 94 may be formed directly on the base member 90. Specifically, first, as illustrated in FIG. 8A, a conductive resin block 292 is formed by applying a conductive resin material in the form of a paste to the first surface 92a of the base member 90 and then curing the material using heat or the like. Next, as illustrated in FIG. 8B, the cured conductive resin block 292 is shaped by subjecting the top and side surfaces of the conductive resin block 292 to removal machining, and a substrate holding member 294 of a prescribed shape is thus obtained. In this example, the substrate holding member 294 includes a first part 294a and a second part 294b that has a larger cross-sectional width than the first part 294a. The substrate holding member 294 may be formed in a prism-like shape in which the side surfaces of a columnar body are configured so as be flat. In addition, as has already been described, the substrate holding member may be formed in a cylindrical shape or a truncated cone shape configured such that a side surface of a columnar body of the substrate holding member is curved, and in this case, since the side surface of the columnar body is already configured to be curved as a result of the conductive resin material in the form of a paste being cured using heat or like as illustrated in FIG. 8A, it is sufficient to perform shaping in which only the top surface of the conductive resin block 292 is cut in FIG. 8B. Corner portions of the substrate holding member may be subjected to chamfering.

Figure 9A:
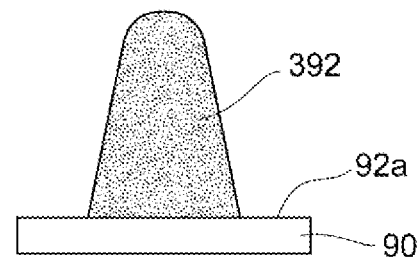
FIGS. 9A through 9C are diagrams for explaining methods of manufacturing a piezoelectric oscillation device according to an embodiment of the present invention.
Figure 9B:
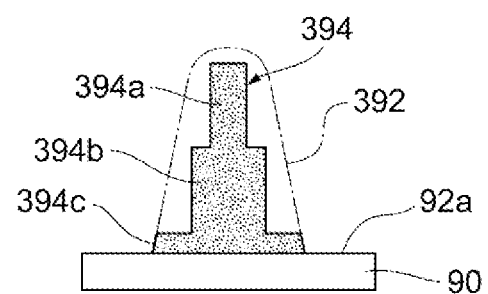
Figure 9C:
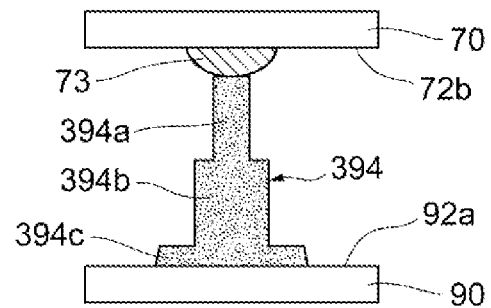

As another further modification, as illustrated in FIGS. 9A to 9C, on the base member 90, a substrate holding member 394 may be formed that includes a first part 394a, a second part 394b having a larger cross-sectional width than the first part 394a, and a third part 394c that has a larger cross-sectional width than the second part 394b. This shape can be obtained by shaping a conductive resin block 392 formed on the first surface 92a of the base member 90 using, for example, a dicing blade.

According to the manufacturing method illustrated in FIGS. 8 and 9, the substrate holding member can be formed directly on the base member 90, and therefore the piezoelectric oscillation device 1 can be manufacturing using a small number of steps.

Assuming a uniform material having a temperature difference $\Delta T$ between a high-temperature portion T1 and a low-temperature portion T2, the amount of heat that is transferred can be approximated by formula 1 below. In this case, the smaller the cross-sectional area of a column (average cross-sectional diameter) or the larger the length of the column, the smaller the amount of heat that is transferred by thermal conduction.

Amount of heat transferred=(thermal conductivity× cross-sectional area/length)×(T1−T2)    Formula 1.

An aspect ratio $\gamma$ of the substrate holding member is given by H/D, where D is the average cross-sectional width of the substrate holding member (for example, average diameter) and H is the average height of the substrate holding member. When the substrate holding member has a solid structure, the amount of heat that is transferred can be made small by making the aspect ratio $\gamma$ high. As a result, a high thermal insulation effect is obtained. From the viewpoint of the thermal insulation effect, the value of the aspect ratio $\gamma$ is preferably greater than or equal to 2. On the other hand, when the substrate holding member is formed so as to have a long thin structure in order to make the aspect ratio $\gamma$ high, the mechanical strength of the substrate holding member becomes lower. From the viewpoint of maintaining the mechanical strength of the substrate holding member 94, the value of the aspect ratio $\gamma$ is preferably less than or equal to 5 and the value of the aspect ratio $\gamma$ is further preferably less than or equal to 4.

In addition, toppling over of the substrate holding member occurring when the substrate holding member is subjected to a removal machining process and an assembly process can be reduced by performing machining such that a cross-sectional dimension of a bottom part of the substrate holding member is given a large step shape. Thus, a removal machining process and an assembly process can be easily implemented. In particular, when a separately formed substrate holding member is arranged on the base member 90 rather than a substrate holding member being directly formed on and bonded to a surface of the base member 90, the substrate holding member can be prevented from toppling over when assembly is performed and the arrangement process and the machining process are simplified. In addition, in the case where the substrate holding member is formed together with the base member 90, the substrate holding member generated by machining stress when the substrate holding member is subjected to cutting machining can be prevented.

Although a mode in which a conductive resin block is subjected to shaping processing has been described above, the present invention is not limited to this mode, and a substrate holding member having a prescribed shape can instead be formed by for example pouring a conductive resin material in the form of a paste into a molding member having a prescribed shape and curing the material using heat or the like or chemically curing the material. According to this mode, the amount of material used can be reduced and the substrate holding member can be easily formed.

With the method of manufacturing a piezoelectric oscillation device according to this embodiment, as has already been described, a piezoelectric oscillation device can be manufactured that can efficiently heat the piezoelectric vibration element 10 and can reduce power consumption.

As described above, with the piezoelectric oscillation device and manufacturing method therefor according to embodiments of the present invention, the following operational effects can be realized by adopting any of the configurations described above.

According to a configuration described above, a substrate on which a heating element is provided is held on a base member via a substrate holding member that includes a conductive part having a lower thermal conductivity than a metal such as copper or aluminum, and therefore the amount of heat, out of heat generated by the heating element, that radiates to the outside via the substrate holding member can be suppressed.

According to a configuration described above, the conductive part is composed of a conductive resin material (epoxy-based conductive resin material), and therefore a substrate holding member that includes a conductive part having a low thermal conductivity can be obtained with a simple configuration. The thermal conductivity may be measured using a steady heat flow measurement method.

According to a configuration described above, the substrate holding member is a columnar body, and therefore the substrate can be stably held on the base member. In addition, since the substrate holding member is a columnar body, adjusting the height and cross-sectional width of the substrate holding member is a simple matter. Therefore, the amount of heat radiated to the outside via the substrate holding member can be easily adjusted. In particular, the amount of heat radiated to the outside via the substrate holding member can be further reduced by making the height of the substrate holding member larger than the cross-sectional width of the substrate holding member.

The purpose of the embodiments described above is to enable easy understanding of the present invention and the embodiments are not to be interpreted as limiting the present invention. The present invention can be modified or improved without departing from the gist of the invention and equivalents to the present invention are also included in the present invention. In other words, appropriate design changes made to the embodiments by one skilled in the art are included in the scope of the present invention so long as the changes have the characteristics of the present invention. For example, the elements included in the embodiments and the arrangements, materials, conditions, shapes, dimensions, and so forth of the elements are not limited to those exemplified in the embodiments and can be appropriately changed. In addition, the elements included in the embodiments can be combined as much as technically possible and such combined elements are also included in the scope of the present invention so long as the combined elements have the characteristics of the present invention.

REFERENCE SIGNS LIST 1 piezoelectric oscillation device
10 piezoelectric vibration element
50 piezoelectric vibrator
60 heating element
62 electronic component
70 substrate
80 lid member
90 base member
94 substrate holding member

The invention claimed is:

1. A piezoelectric oscillation device comprising:
a piezoelectric vibrator including a piezoelectric vibration element;
a heating element that heats the piezoelectric vibration element;
an electronic component that is electrically connected to the piezoelectric vibration element;
a substrate on which the piezoelectric vibrator, the heating element and the electronic component are mounted; and
a base member, the substrate being attached to and spaced from the base member via a substrate holding member comprising a conductive part which includes (i) a conductive resin material which has a lower thermal conductivity than metal and (ii) a covering part covering the conductive part and having a lower thermal conductivity than the conductive part.

2. The piezoelectric oscillation device according to claim 1, wherein the conductive part consists of a conductive resin material.

3. The piezoelectric oscillation device according to claim 1, wherein the conductive resin material includes an epoxy-based conductive resin material.

4. The piezoelectric oscillation device according to claim 1, wherein the substrate holding member is entirely formed of the conductive part.

5. The piezoelectric oscillation device according to claim 1, wherein the substrate holding member is a columnar body.

6. The piezoelectric oscillation device according to claim 5, wherein a ratio of an average height of the columnar body with respect to an average cross-sectional width of the columnar body is greater than or equal to 2.

7. The piezoelectric oscillation device according to claim 6, wherein the ratio of the average height of the columnar body with respect to the average cross-sectional width of the columnar body is less than or equal to 5.

8. The piezoelectric oscillation device according to claim 7, wherein the ratio of the average height of the columnar body with respect to the average cross-sectional width of the columnar body is less than or equal to 4.

9. The piezoelectric oscillation device according to claim 1, wherein the electronic component is electrically connected to the piezoelectric vibration element and is an integrated circuit element that includes an oscillation circuit that generates a clock signal.

10. The piezoelectric oscillation device according to claim 1, further comprising a lid member that is attached to the base member such that the piezoelectric vibrator and the substrate are housed therein.

11. A method of manufacturing a piezoelectric oscillation device, the method comprising:
(a) mounting, on a substrate, a piezoelectric vibrator that includes a piezoelectric vibration element, a heating element that heats the piezoelectric vibration element, and an electronic component that is electrically connected to the piezoelectric vibration element; and
(b) attaching the substrate to a base member with a space there between using at least one substrate holding member, at least one of the substrate holding members including a conductive part comprising a conductive resin having a lower thermal conductivity than metal and a covering part covering the conductive part and having a lower thermal conductivity than the conductive part.

12. The piezoelectric oscillation device according to claim 11, wherein the conductive part consists of a conductive resin material.

13. The method of manufacturing a piezoelectric oscillation device according to claim 11, further comprising forming at least one of the substrate holding members by at least:
forming a conductive resin block by applying a conductive resin material in the form of a paste to a sheet and curing the conductive resin material;
shaping the conductive resin block on the sheet;
obtaining a plurality of the substrate holding members by dividing the conductive resin block on the sheet into individual substrate holding members; and
removing each substrate holding member from the sheet.

14. The method of manufacturing a piezoelectric oscillation device according to claim 11, further comprising forming at least one of the substrate holding members by at least:
forming a conductive resin block by applying a conductive resin material in the form of a paste to the base member and curing the conductive resin material; and
shaping the conductive resin block on the base member.

15. The method of manufacturing a piezoelectric oscillation device according to claim 11, wherein further comprising forming at least one of the substrate holding members by at least pouring the conductive resin material in the form of a paste into a molding member and curing the conductive resin material.

16. The method of manufacturing a piezoelectric oscillation device according to claim 11, wherein the electronic component is electrically connected to the piezoelectric vibration element and is an integrated circuit element that includes an oscillation circuit that generates a reference signal that is a clock signal.

17. A method of manufacturing a piezoelectric oscillation device, the method comprising:
   (a) mounting, on a substrate, a piezoelectric vibrator that includes a piezoelectric vibration element, a heating element that heats the piezoelectric vibration element, and an electronic component that is electrically connected to the piezoelectric vibration element;
   (b) forming at least one substrate holding member that is for holding the substrate on the base member, the substrate holding member including a conductive part comprising a conductive resin having a lower thermal conductivity than metal, the at least one substrate holding member being formed by, at least:
      (i) forming a conductive resin block by applying a conductive resin material in the form of a paste to a sheet and curing the conductive resin material;
      (ii) shaping the conductive resin block on the sheet;
      (iii) obtaining a plurality of the substrate holding members by dividing the conductive resin block on the sheet into individual substrate holding members; and
      (iv) removing each substrate holding member from the sheet; and
   (c) attaching the substrate to the base member with a prescribed spacing there between via the substrate holding member.

18. A method of manufacturing a piezoelectric oscillation device, the method comprising:
   (a) mounting, on a substrate, a piezoelectric vibrator that includes a piezoelectric vibration element, a heating element that heats the piezoelectric vibration element, and an electronic component that is electrically connected to the piezoelectric vibration element;
   (b) forming at least one substrate holding member that is for holding the substrate on the base member, the substrate holding member including a conductive part comprising a conductive resin having a lower thermal conductivity than metal, the at least one substrate holding member being formed by, at least:
      (i) forming a conductive resin block by applying a conductive resin material in the form of a paste to the base member and curing the conductive resin material; and
      (ii) shaping the conductive resin block on the base member; and
   (c) attaching the substrate to the base member with a prescribed spacing there between via the substrate holding member.

* * * * *